United States Patent
Lian et al.

[11] Patent Number: 5,989,471
[45] Date of Patent: Nov. 23, 1999

[54] BGA MOULD ASSEMBLY FOR ENCAPSULATING BGA SUBSTRATES OF VARYING THICKNESS

[75] Inventors: Tiang Siong Lian; Soon Chye Lian; Zhen Hua He, all of Singapore, Singapore

[73] Assignee: Advanced Systems Automation Limited, Singapore, Singapore

[21] Appl. No.: 08/879,245

[22] Filed: Jun. 19, 1997

[30] Foreign Application Priority Data

Jul. 25, 1996 [SG] Singapore ............................ 9610347-8

[51] Int. Cl.⁶ ...................................................... B29B 13/00

[52] U.S. Cl. ........................ 264/271.1; 425/116; 425/150; 425/167; 425/406; 425/451.4; 425/451.7; 425/451.9; 100/258 R; 100/291; 100/323; 100/325; 118/500; 118/503

[58] Field of Search ..................................... 118/500, 503; 425/116, 150, 451.9, 451.7, 451.4, 167, 406; 269/25; 264/271.1; 100/291, 258 R, 323, 325

[56] References Cited

U.S. PATENT DOCUMENTS

| | | | |
|---|---|---|---|
| 4,828,475 | 5/1989 | Kamiguchi | 425/150 |
| 5,087,190 | 2/1992 | Laghi | 425/145 |
| 5,118,271 | 6/1992 | Baird et al. | 425/116 |
| 5,378,140 | 1/1995 | Asano et al. | 425/451.9 |

*Primary Examiner*—Laura Edwards
*Attorney, Agent, or Firm*—Lawrence Y. D. Ho; David D. Chung; Jacqueline C. T. Lui

[57] ABSTRACT

A BGA mould assembly which can facilitate high degree of control over the clamping force on BGA substrates of varying thickness. An Independent drive is provided for each of the dual in-line cavity bars which clamp the BGA substrates. The drive mechanism is a wedge press which includes a servo motor, and a linear-conversion mechanism coupled to the servo motor to convert the rotation motion of the motor to a linear movement. An input wedge is coupled to the linear-conversion mechanism such that the input wedge moves correspondingly with the linear movement of the linear conversion mechanism. An output wedge is coupled to the cavity bar and positioned such that a horizontal movement by the input wedge causes the output wedge to move downwards. A roller cage is provided at the top and bottom of the input wedge to reduce friction.

9 Claims, 4 Drawing Sheets

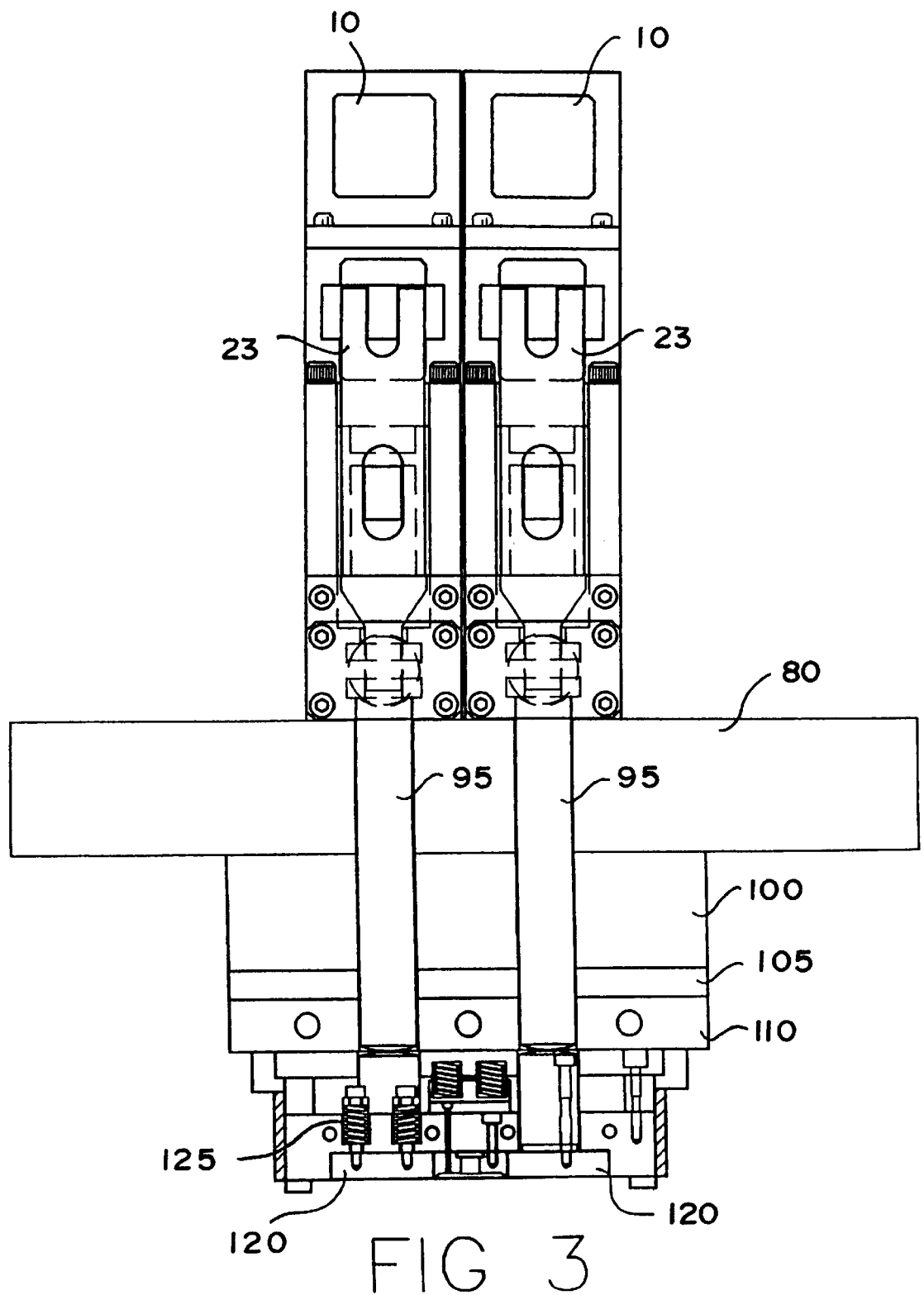

BGA MOULD ASSEMBLY FOR ENCAPSULATING BGA SUBSTRATES OF VARYING THICKNESS

FIELD OF THE INVENTION

This invention relates generally to the field of semiconductor packaging, and particularly to a BGA mould assembly which can encapsulate BGA substrates of varying thickness without damaging the substrates, and without requiring any adjustments in the assembly.

BACKGROUND OF THE INVENTION

Ball grid arrays (BGAs) are a relatively new semiconductor device which utilize a different manufacturing process than some of the other similar devices such as the quad flat packages (QFPs) and thin quad flat packages (TQFPs). Currently, BGAs are produced using PCB technology which involves a multi-coating process. Inherent in the this multi-coating process is the problem of controlling the thickness of final product. Therefore, unlike QFPs, for instance, where the thickness can be controlled within a tolerance ±0.01 mm, BGA specification typically calls for a tolerance as high as 0.1 millimeter. So the maximum variation between the thinnest BGA substrate within the required tolerance and the thickest BGA substrate within the tolerance can be as high as 0.2 millimeters.

This variation in thickness can create various problems for the existing BGA moulding tools during a clamping operation. A typical BGA moulding assembly has a top and bottom cavity bars which make direct contact with the BGA substrate. During a clamping operation, the top and bottom cavity bars are brought together with the BGA substrate positioned in between the bars. This clamping operation is crucial in the BGA fabrication for securing the substrate before resin compound is delivered. Good control over the clamping operation is important to ensure that the substrates are not scratched or damaged during the clamping operation and that sufficient clamping force is applied to minimize leakage of the resins during the moulding operations of the packaging process. Because tight fitting of the top and bottom cavity bars is essential, the current BGA mould assemblies are designed to accept substrates having a narrow range of thickness. This is because when a substrate is too thick, a leakage may result from improper clamping of the top and bottom cavity bars. In addition, the substrate may be irreparably damaged if excessive force is exerted in an attempt to fully mate the cavity bars.

Currently, virtually every BGA moulding system uses a dual in-line system where two sets of BGA substrates are encapsulated at the same time. This requires two identical sets of cavity bars which must be placed near each other side by side. Both of the cavity bars are controlled by single driving mechanism, e.g., hydraulic press, and so each bar cannot work independent of each other. This limitation is particularly problematic when the two substrates being encapsulated are of different thickness. Since the press has no way of accounting for the difference in thickness, it attempts to exert the same amount of force on both. Consequently, one of the substrates is over-cramped and damage occurs.

To prevent the over-cramping from occurring, springs were added to the cavity bars with each bar being able to exert different amount of force to its respective substrates. As FIG. 1 demonstrates, the amount of force being exerted onto the substrates is wholly depended on the compression of the springs which in turn is depended on the thickness of the substrate. So where a pair of substrates has different thickness, different amount of force is exerted onto each substrate. Note that the springs in the left mould assembly are much more compressed than the springs in the right mould assembly.

In other situations, a pair of substrate may have the same thickness. However, their thickness may vary from the thickness of a pair from a different batch, as shown in FIGS. 2A and 2B. Note that the substrates in FIG. 2B are much thinner than the substrates in FIG. 2A, and hence, their corresponding springs of FIG. 2B are much less compressed than the springs of FIG. 2A. Therefore, the substrates in FIG. 2A experience greater clamping force than the substrates in FIG. 2B.

It can be seen from these illustrations that there is no control over the clamping force in the current BGA moulding systems, and that the force varies from substrate to substrate. The result is that in some cases, the clamping force is excessive; in other cases, the force is inadequate. Where there is excessive force, the substrate is damaged; where not enough force is exerted, there can be leakage of a resin material.

Despite these problems, the spring-buffered cavity bars are the standard in virtually all of the current BGA moulding systems, and while many BGAs fail to meet the performance specification, the industry has failed to provide a BGA moulding system which can eliminate or effectively reduce these problems. Indeed, to the best of the inventor's knowledge, no BGA mould assembly is currently available which can consistently accommodate BGA substrates having a wide range of thickness, simultaneously handle a pair substrates having different thickness, and which can precisely control the amount of force being exerted onto each substrate. Clearly, there is a need in the industry for a BGA moulding assembly which overcomes these shortcomings to provide to an assembly which can controllably exert the right amount of clamping force to each substrate.

OBJECT OF THE INVENTION

It is therefore the primary object of the present invention to overcome the shortcomings stated above to provide a BGA mould which can consistently accommodate BGA substrates having a wide range of thickness, simultaneously handle a pair substrates having different thickness, and which can precisely control the amount of force being exerted onto each substrate.

SUMMARY OF THE INVENTION

The present invention is a top BGA mould assembly of a complete moulding system which facilitates the handling of BGA substrates of various thickness. The present BGA mould assembly still incorporates the dual in-line configuration as in the previous BGA moulding systems as described in the Background section. However, the it utilizes independent drive mechanisms to clamp each of the BGA substrates. This is unlike any of the previous BGA moulding systems where only a single drive, usually a hydraulic press, was used to clamp both of the BGA substrates. By having an independent drive, the present BGA mould assembly is better able to control the clamping force exerted on each of the BGA substrates.

The preferred drive mechanism of the present invention is a wedge press which includes a servo motor, a linear-conversion mechanism coupled to the servo motor by a driving pulley, driven pulley, and a timing belt. The linear-conversion mechanism converts the rotation motion created by the servo motor to a linear movement. The linear-conversion mechanism includes a ball screw, a thrust bearing connected to the ball screw at an end, a nut encased in a nut housing, the nut screwed into the ball screw, a cam follower for guiding the nut housing, and a pull linkage connected to the nut housing such that a rotational movement of the ball screw causes the nut and the nut housing to move linearly.

An input wedge having a top and bottom is coupled to the linear-conversion mechanism by a input lever. The input lever is rotatably joined to the pull linkage at an end, rotatably attached to a pivot located on a sliding bar at an opposite end, and rotatably joined to a push linkage in between the two ends. The push linkage is also fixedly joined to the input wedge. An output wedge is coupled to the cavity bar and positioned such that a movement by the input wedge causes the output wedge to move in a direction substantially perpendicular to the movement of the input wedge. A roller cage is disposed on the top and at the bottom of the input wedge for reducing friction during the movement of the input wedge As the input wedge moves in a horizontal direction, the bottom moves in a vertical direction. The output wedge is coupled to a cavity bar which moves with the output wedge.

The wedge press of the present invention facilities high degree of control over the clamping force on the BGA substrate. The wedge press is particularly suited for semiconductor packaging processes as the output force bears a linear relationship with the input force to allow high level of control of the force output, a necessary condition in semiconductor packaging operations. In addition, unlike a hydraulics mechanism, the present invention does not utilize any fluids to amplify the force. Therefore, it is highly adaptable for semiconductor packaging applications performed in a clean room environment because there is no worry of leakage or other fluid-related problems which may contaminate the environment. Furthermore, because the present invention can be built using many of the standard components and custom components which are easy to fabricate, it facilitates virtually maintenance-free operation, rapid production, and relatively inexpensive implementation.

BRIEF DESCRIPTION OF THE DRAWINGS

FIG. 3 illustrates the front view of the BGA mould assembly.

DETAILED DESCRIPTION OF THE INVENTION

Figure 1:
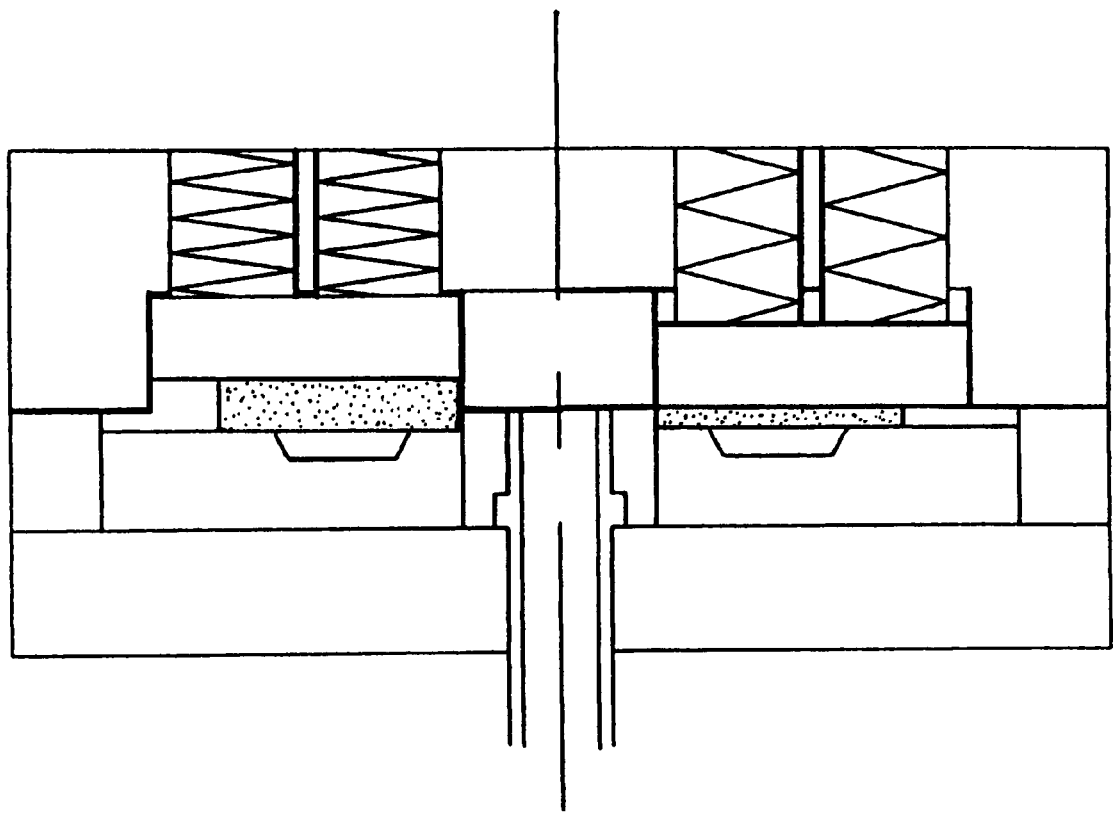
FIG. 1 (Prior Art) illustrates a problem associated with a previous BGA moulding assembly.
Figure 2A:
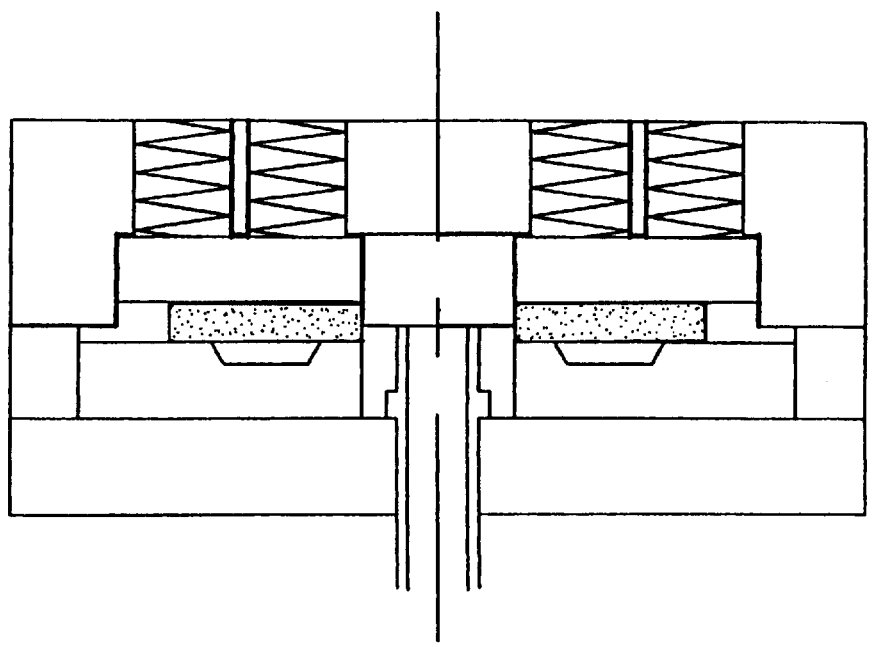
FIG. 2A (Prior Art) illustrates a problem associated with a previous BGA moulding assembly.
Figure 2B:
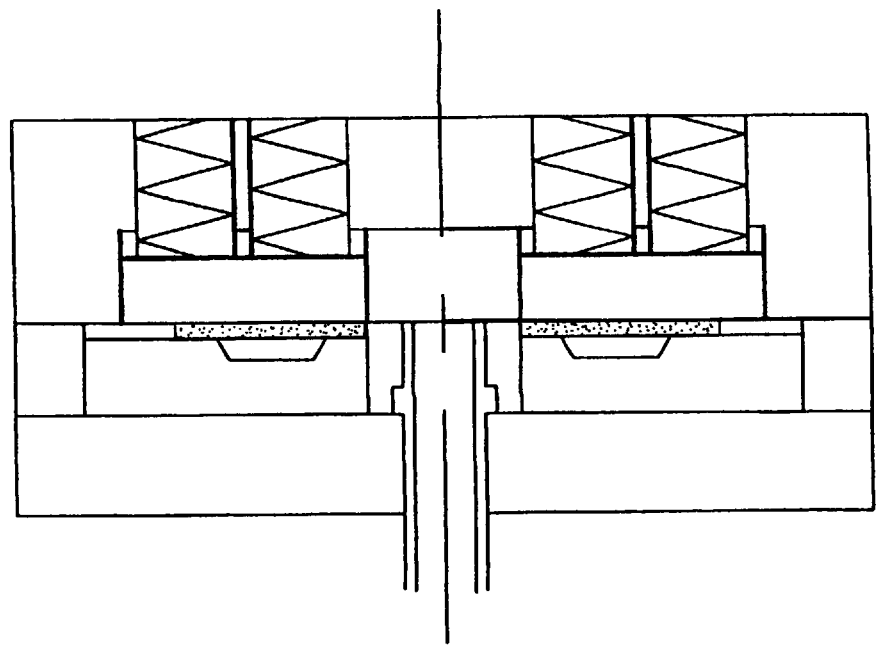
FIG. 2B (Prior Art) illustrates a problem associated with a previous BGA moulding assembly.
Figure 4:
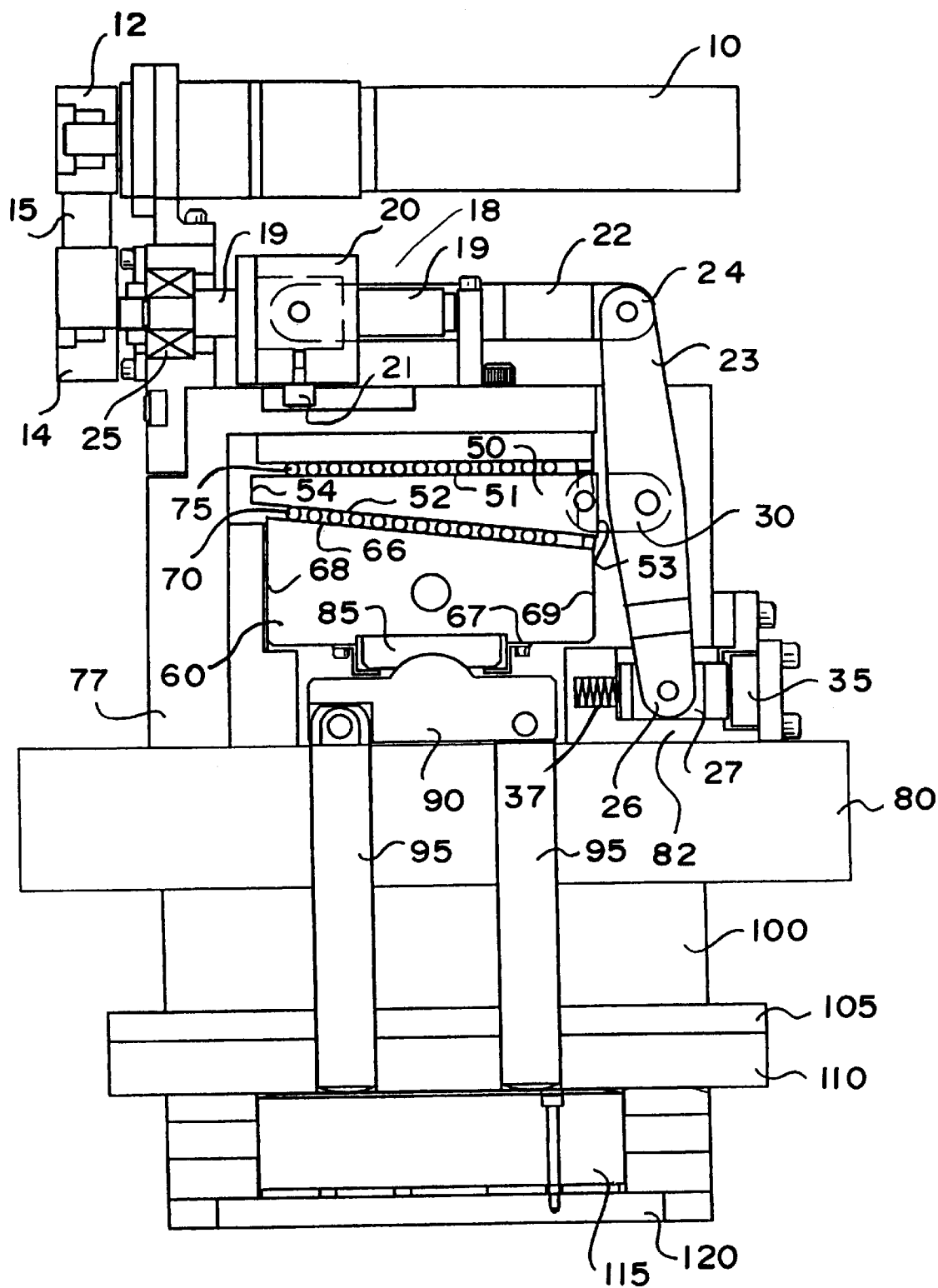
FIG. 4 illustrates the side view of the BGA mould assembly.

The present invention is a BGA mould assembly which can facilitate the handling of BGA substrates of various thickness. FIGS. 3 and 4 illustrate the preferred embodiment of the present invention which is the top mould assembly of a complete BGA moulding system. Referring to FIG. 3, the present BGA mould assembly still incorporates the dual in-line configuration as in the previous BGA moulding systems as described in the Background section. However, the present invention utilizes independent drive mechanisms to clamp each of the BGA substrates. This is unlike any of the previous BGA moulding systems where only a single drive, usually hydraulics, was used to clamp the BGA substrate. By having an independent drive, the present BGA mould assembly is better able to control the clamping force exerted on each of BGA substrates.

Various types of driving mechanisms are theoretically possible to facilitate the independent control of the dual in-line clamping operation. However, the present systems such as the hydraulic presses are not ideally suited for BGA moulding assemblies as they tend to be bulky, expensive, and/or unsuitable for the particular environment which the clamping operations are conducted under. Hence, the present invention incorporates a wedge press as its driving mechanism. The details of this wedge press are shown in FIG. 4. The press is driven by a servo motor 10. Because the desired movement is linear, a mechanism is needed to convert the rotational movement of the motor 10 to a linear movement. This conversion is achieved by strapping a timing belt 15 onto a driving pulley 12 of the motor 10 and the driven pulley 14 of the linear-conversion mechanism 18. The respective diameters of the pulley 14 the pulley 12 may strategically chosen to achieve a force amplification, if such amplification is desired. Although the timing belt 15 is preferably used in the present invention to achieve the necessary control, other connecting devices such as, chains or gears can also be used.

The linear-conversion mechanism in FIG. 4 comprises a ball screw 19 and a nut (not shown) which is encased in a housing 20. The ball screw 19 is connected to the pulley 14 via a thrust bearing assembly 25 and the screw 19 rotates correspondingly with the movement of the belt 15. As the screw 19 rotates, the nut in housing 20 is prevented from rotating, and hence it and the housing 20 moves translationally as its threading interacts with the threading of the screw 19. A cam follower 21 fixed to the housing 20 is provided to guide the movement of the housing. The housing 20 is firmly connected to a pull linkage 22 at an end of the linkage 22, which moves co-linearly with the housing 19. Rotatably connected via a rotating joint 24 at the opposite end of the pull linkage 22 is an input lever 23. The input lever 23 rotates around a pivot 26 which is located on a sliding bar 27. At the left end of the bar 27 is a pre-load spring 37, and at the opposite end is a load cell 35. The sliding bar 27 is placed in a cavity disposed in an extended portion 82 of the top mould platen 80. The pre-load spring 37 pushes against the sliding bar 27 to provide a pro-load force on the loadcell 35.

Due to the location of the load cell 35, it does not experience the total force amplification generated by the wedge press, and therefore, the force measured by the load cell 35 is much less than the actual output force exerted by the wedge press. However, the force experienced by the load cell is linearly proportional to the output force, and therefore, the actual force is calculated from the reading of the load cell measurements by a micro-controller (not shown) connected to the load cell 35 which takes into account the force amplification achieved by the wedge press.

An input wedge 50 is firmly connected to an end of a push linkage 30, and the push linkage 30 is rotatably connected to the input lever 23 in between the joint 24 and pivot 26 at its other end. Although the pull linkage 22 can be directly connected to the input wedge 50, it is preferred that the input lever 30 of the type shown in FIG. 4 be provided. The input lever 30 serves three main functions. First, it facilitate force amplification through its leverage. Second, it creates distance between the servo motor 10, which can create unwanted heat, and the BGA moulding area. And third, it allows the press to be stacked vertically manner in a space-efficient manner. Efficient use of space is important in a BGA mould assembly, as space is highly constrained.

The input wedge 50 includes a sloping top 51, a bottom 52, a wide end 53, and a narrow end 54. Although here, the push linkage 30 is preferably connected to the wedge 50 at the wide end 53, it is also possible to connect to the narrow end 54, though this would require some adjustments in regard to the configuration of the output wedge 60. A top roller cage 75 is placed at the top 51 of the wedge 50 and the bottom roller cage 70 is placed at the bottom 52 of the wedge 50. The function of the roller cage is to facilitate friction-reduced translational movement of the bottom wedge 50. Roller cage is a commercially available product which comprise a set of rollers disposed in a solid support. In this preferred embodiment, it is left floating between the parts, though it can be fixed onto the input wedge, the output wedge, or the block body 75. It should be understood that while pre-fabricated caged rollers are preferred because of its ease of use and implementation, other types of rollers or friction-reducing devices can also be used in place of the roller cage.

Below the bottom roller cage 70 is an output wedge 60 having a sloping top 66, a bottom 67, a wide end 68, and a narrow end 69. The input wedge 50 and the output wedge 60 have complementary shapes such that the sloping top 66 of the output wedge 60 and the sloping bottom 52 of the bottom wedge 50 are approximately parallel to each other. Therefore, the bottom wedge top 51 and the output wedge bottom 67 are also substantially parallel to one another. The output wedge 60 moves vertically as the input wedge 50 moves horizontally.

Firmly attached to the wedge bottom 67 is a floating block 85 which serves primarily to prevent wear-and-tear on the bottom wedge 60. Hence, floating block 85 should be made of a wear-resistant material and be easily replaceable. Connected to the floating block by a ball joint is an output lever 90 which is joined to pressure pillars 95. At the other end of the pressure pillars 95 is a supporting block 115 which spreads the force of the pressure pillars 95 over a wide surface area so as to prevent damage to the top cavity bar 120 which directly interfaces with the BGA substrates. Springs 125 (shown in FIG. 3) are disposed between the cavity bar 120 and the supporting block 115 to place the cavity bar 120 in its home position after a clamping operation. The springs 125 in the present invention does not serve the same or similar function of the springs in the prior art systems where they were used to prevent over-cramping so as to avoid damaging the BGA substrates.

The floating block 85, output lever 90, the pressure pillar 95, supporting block 115, and the cavity bar 120 moves colinearly with the output wedge 60. Because of the force amplification achieved by the wedge assembly, the output force can be made to be many times greater than the input force.

Providing the frame support for the wedge press is the block body 77, top mould platen 80, and the deflection block 100. A top heat platen 110 is provided near the cavity bar 120 to provide heat to the BGA substrates during a clamping operation. Because this heat is undesirable for the wedge mechanism, a top insulator plate 105 thermally separates the wedge mechanism with the top heat platen 110.

The wedge press of the present invention facilities high degree of control over the clamping force on the BGA substrate. The wedge press is particularly suited for semiconductor packaging processes as the output force bears a linear relationship with the input force to allow high level of control of the force output, a necessary condition in semiconductor packaging operations. In addition, unlike a hydraulics mechanism, the present invention does not utilize any fluids to amplify the force. Therefore, it is highly adaptable for semiconductor packaging applications performed in a clean room environment because there is no worry of leakage or other fluid-related problems which may contaminate the environment. Furthermore, because the present invention can be built using many of the standard components and custom components which are easy to fabricate, it facilitates virtually maintenance-free operation, rapid production, and relatively inexpensive implementation.

It should be understood by those skilled in the art that while the preferred embodiment has been described here as a way of fully disclosing a way to make and use the present invention, various modifications, additions and substitutions are possible for the embodiments without departing from the scope and spirit of the invention as disclosed in the accompanying claims.

We claim:

1. A BGA mould assembly for facilitating an encapsulation of BGA substrates having varying thickness, said assembly having dual in-line cavity bars which clamp BGA substrates during an encapsulation process, said mould assembly comprising:

a first drive mechanism for controllably applying clamping force to a first cavity bar for clamping a first BGA substrate, a second drive mechanism for controllably applying clamping force to a second cavity bar for clamping a second BGA substrate, said first drive mechanism and second drive mechanism each including, a servo motor;

a linear-conversion means coupled to said servo motor for converting a rotation motion created by said servo motor to a linear movement;

an input wedge having a top and bottom coupled to said linear-conversion means such that said input wedge moves correspondingly with said linear movement generated by the linear conversion means;

an output wedge coupled to the first and second cavity bars, said output wedge situated such that a movement by said input wedge causes said output wedge to move in a direction substantially perpendicular to the movement of said input wedge;

a friction-reducing means disposed on said top and bottom of said input wedge for reducing friction during the movement of said input wedge;

a supporting frame for said drive mechanisms, whereby said first drive mechanism and said second drive mechanism can control said first cavity bar and said second cavity bar independently from each other such that a different clamping force can be applied to said first and second drive mechanisms to account for a different thickness between said first and second BGA substrates.

2. The mould assembly as recited in claim 1 further comprising a load cell coupled to said linear-conversion means to measure a force exerted by said linear-conversion means.

3. The mould assembly as recited in claim 1 further comprising:

a top heat platen disposed above said first and second cavity bars; and a top insulator plate located above said top heat platen to thermally separate the top heat platen and said drive mechanisms.

4. The mould assembly as recited in claim 1 wherein said servo motor is coupled to said linear conversion means by a driving pulley, driven pulley, and a timing belt.

5. The mould assembly as recited in claim 1 wherein said linear-conversion means comprises:

a ball screw;

a thrust bearing connected to said ball screw at an end;

a nut encased in a nut housing, said nut screwed into said ball screw;

a cam follower for guiding said nut housing; and a pull linkage connected to said nut housing, whereby a rotational movement of said ball screw causes the nut and the nut housing to move linearly.

6. The mould assembly as recited in claim 5 wherein said input wedge is coupled to said linear-conversion means by a input lever, said input lever rotatably joined to said pull linkage at an end, rotatably attached to a pivot at an opposite end, and rotatably joined to a push linkage in between said ends, said push linkage also fixedly joined to said input wedge.

7. The mould assembly as recited in claim 1 wherein said output wedge is coupled to said cavity bar by a floating block fixedly attached to said output wedge, an output lever joined to said floating block by a ball joint, said output lever joined to pressure pillars at an end, and a supporting block connected to said pressure pillars at an opposite end.

8. The mould assembly as recited in claim 1 wherein said friction-reducing means is a roller cage.

9. A method of clamping BGA substrates having varying thickness in a BGA mould assembly, said assembly having dual in-line cavity bars which clamp BGA substrates during an encapsulation process, said method comprising:

placing a first BGA substrate under a first cavity bar and a second BGA substrate under a second cavity bar, said first BGA substrate having a different thickness than said second BGA substrate;

clamping said first BGA substrate using a first drive mechanism;

controllably applying a sufficient clamping force to said first BGA substrate using said first drive mechanism;

clamping said second BGA substrate using a second drive mechanism;

controllably applying a sufficient clamping force to said second BGA substrate using said second drive mechanism, said clamping force applied by said second drive mechanism being different than the clamping force applied by said first drive mechanism;

wherein said first drive mechanism and said second drive mechanism operate independently from each other such that a different clamping force is applied by said first and second drive mechanisms to account for a difference in thickness between said first and second BGA substrates.

* * * * *